(12) United States Patent
Li et al.

(10) Patent No.: US 11,991,837 B2
(45) Date of Patent: May 21, 2024

(54) CIRCUIT BOARD AND MANUFACTURING METHOD THEREOF

(71) Applicant: Unimicron Technology Corp., Taoyuan (TW)

(72) Inventors: Ke-Chien Li, Taoyuan (TW);
Chun-Hung Kuo, Taoyuan (TW);
Chih-Chun Liang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 26 days.

(21) Appl. No.: 17/683,371

(22) Filed: Mar. 1, 2022

(65) Prior Publication Data

US 2022/0408567 A1 Dec. 22, 2022

Related U.S. Application Data

(60) Provisional application No. 63/213,690, filed on Jun. 22, 2021.

(30) Foreign Application Priority Data

Jan. 24, 2022 (TW) .................................. 111102876

(51) Int. Cl.
*H05K 3/46* (2006.01)
*H05K 1/11* (2006.01)

(52) U.S. Cl.
CPC ........... *H05K 3/4644* (2013.01); *H05K 1/115* (2013.01)

(58) Field of Classification Search
None
See application file for complete search history.

(56) References Cited

U.S. PATENT DOCUMENTS 7,071,424 B1 * 7/2006 Shirai .................. H05K 3/4661
174/263
9,867,284 B2 1/2018 Kreutzwiesner et al.
(Continued)

FOREIGN PATENT DOCUMENTS

JP  2016222526 A  * 12/2016  ......... G02F 1/13439
TW  201627420      8/2016

OTHER PUBLICATIONS (JP 2016/222526 A) (Translation) (Year: 2023).*
"Office Action of Taiwan Counterpart Application", issued on Aug. 3, 2022, p. 1-p. 9.

*Primary Examiner* — Timothy J Thompson
*Assistant Examiner* — John B Freal
(74) *Attorney, Agent, or Firm* — JCIPRNET

(57) ABSTRACT

A circuit board includes a substrate, a build-up circuit structure, a graphene oxide layer, a graphene layer, and an insulating material layer. The build-up circuit structure is disposed on the substrate, including at least one inner circuit, at least one dielectric layer, an outer circuit, and multiple conductive vias. The dielectric layer is disposed on the inner circuit. The outer circuit is disposed on the dielectric layer. The conductive vias penetrate the dielectric layer and electrically connect the inner circuit and the outer circuit. The graphene oxide layer and the graphene layer are disposed on the build-up circuit structure at an interval. The graphene oxide layer and the graphene layer are respectively disposed in correspondence to the dielectric layer and the outer circuit. The insulating material layer is disposed on the graphene oxide layer and the graphene layer. The insulating material layer has an opening, which exposes the graphene layer.

15 Claims, 6 Drawing Sheets

(56) References Cited

U.S. PATENT DOCUMENTS

2016/0358877 A1* 12/2016 Chou ............... H01L 24/13
2018/0368266 A1* 12/2018 Yeh ................ H05K 3/06
2019/0116663 A1    4/2019 Findley
2020/0357766 A1   11/2020 Su

* cited by examiner

CIRCUIT BOARD AND MANUFACTURING METHOD THEREOF

CROSS-REFERENCE TO RELATED APPLICATION

This application claims the priority benefits of U.S. provisional application Ser. No. 63/213,690, filed on Jun. 22, 2021, and Taiwan application serial no. 111102876, filed on Jan. 24, 2022. The entirety of each of the above-mentioned patent applications is hereby incorporated by reference herein and made a part of this specification.

BACKGROUND

Technical Field

The disclosure relates to a circuit board and a manufacturing method thereof, and more particularly to a circuit board and a manufacturing method thereof that may improve poor heterogeneous adhesion.

Description of Related Art

Most of the existing surface binders are used to enhance the binding force of an organic/metal interface, but there is yet no surface binder that may be used for an organic/metal interface as well as for an organic/organic interface. For example, due to the insufficient binding force of an interface between a solder mask dielectric material (such as solder mask ink) and an outer circuit, during electroless plating for a surface treatment process, such as an electroless nickel electroless palladium immersion gold (ENEPIG) process, it is often found that penetration and discoloration of plating take place on the bottom sidewall of an opening of a solder mask dielectric material.

In addition, although the surface roughness of the outer circuit may be increased through roughening to enhance the binding force of the interface between the solder mask dielectric material and the outer circuit, the outer circuit after surface roughening affects signal transmission and even causes signal loss.

SUMMARY

The disclosure provides a circuit board and a manufacturing method thereof that may improve poor heterogeneous adhesion or may enhance reliability and yield.

The circuit board of the disclosure includes a substrate, a build-up circuit structure, a graphene oxide layer, a graphene layer, and an insulating material layer. The build-up circuit structure is disposed on the substrate. The build-up circuit structure includes at least one inner circuit, at least one dielectric layer, an outer circuit, and multiple conductive vias. The dielectric layer is disposed on the inner circuit. The outer circuit is disposed on the dielectric layer. The conductive vias penetrate the dielectric layer and electrically connect the inner circuit and the outer circuit. The graphene oxide layer and the graphene layer are disposed on the build-up circuit structure at an interval. The graphene oxide layer is disposed in correspondence to the dielectric layer, and the graphene layer is disposed in correspondence to the outer circuit. The insulating material layer is disposed on the graphene oxide layer and the graphene layer. The insulating material layer has an opening, and the opening exposes the graphene layer.

In an embodiment of the disclosure, the material of the dielectric layer is different from the material of the insulating material layer.

In an embodiment of the disclosure, the insulating material layer is another dielectric layer or a solder mask layer.

In an embodiment of the disclosure, in the normal direction of the build-up circuit structure, the graphene oxide layer overlaps the dielectric layer, and the graphene layer overlaps the outer circuit.

In an embodiment of the disclosure, the graphene oxide layer contacts the dielectric layer, and the graphene layer contacts the outer circuit.

In an embodiment of the disclosure, the circuit board further includes a conductive material layer. The conductive material layer is disposed in the opening. The conductive material layer is electrically connected to the build-up circuit structure through the graphene layer.

In an embodiment of the disclosure, the graphene oxide layer is located on an interface between the insulating material layer and the dielectric layer, and is located on an interface between the insulating material layer and the outer circuit.

The manufacturing method of the circuit board of the disclosure includes the following steps. First, a substrate is provided. Next, a build-up circuit structure is formed on the substrate. The build-up circuit structure includes at least one inner circuit, at least one dielectric layer, an outer circuit, and multiple conductive vias. The dielectric layer is disposed on the inner circuit. The outer circuit is disposed on the dielectric layer. The conductive vias penetrate the dielectric layer and electrically connect the inner circuit and the outer circuit. Next, a graphene oxide layer is formed on the build-up circuit structure. Next, an insulating material layer is formed on the graphene oxide layer. The insulating material layer has an opening, and the opening exposes a portion of the graphene oxide layer. Afterwards, the portion of the graphene oxide layer is reduced to a graphene layer. The graphene layer is disposed in correspondence to the outer circuit, and another portion of the graphene oxide layer is disposed in correspondence to the dielectric layer.

In an embodiment of the disclosure, a conductive material layer is further formed in the opening in the manufacturing method. The conductive material layer may be electrically connected to the build-up circuit structure through the graphene layer.

In an embodiment of the disclosure, the above step for reducing the portion of the graphene oxide layer to the graphene layer is performed by using plasma or water evaporation for the portion of the graphene oxide layer.

Based on the above, in the circuit board and the manufacturing method thereof in an embodiment of the disclosure, the graphene oxide layer disposed between the insulating material layer and the build-up circuit structure may improve the poor heterogeneous adhesion between the insulating material layer and the build-up circuit structure (i.e., improving the binding force between the insulating material layer and the build-up circuit structure), thereby enhancing the reliability and yield of the circuit board. In addition, with graphene disposed, the conductive material layer may be electrically connected to the build-up circuit structure, which may enhance the heat dissipation effect of the circuit board and may protect the outer circuit from oxidation.

In order to make the aforementioned features and advantages of the disclosure comprehensible, embodiments accompanied with drawings are described in detail below.

DESCRIPTION OF THE EMBODIMENTS

FIG. 1A to FIG. 1G are schematic cross-sectional views showing a manufacturing method of a circuit board according to an embodiment of the disclosure. A manufacturing method of a circuit board 100 in this embodiment may include but not be limited to the following steps.

Figure 1A:
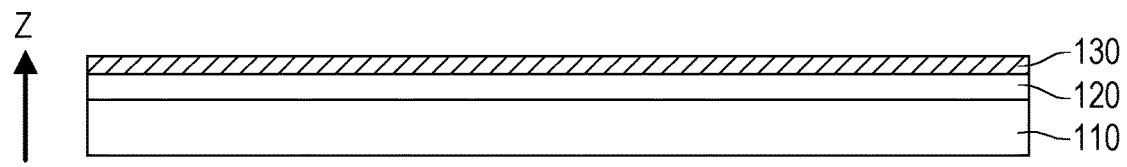
FIG. 1A to FIG. 1G are schematic cross-sectional views showing a manufacturing method of a circuit board according to an embodiment of the disclosure.

First, with reference to FIG. 1A, a substrate 110 is provided, and a release layer 120 and a seed layer 130 are sequentially formed on the substrate 110. The material of the substrate 110 may include glass or other substrate materials that may be used for support, but the disclosure is not limited thereto. The release layer 120 may be removed in the subsequent steps as required. The seed layer 130 may be a monolayer or multilayer metal layer. In this embodiment, the seed layer 130 may include a titanium layer and a copper layer on the titanium layer.

Figure 1B:
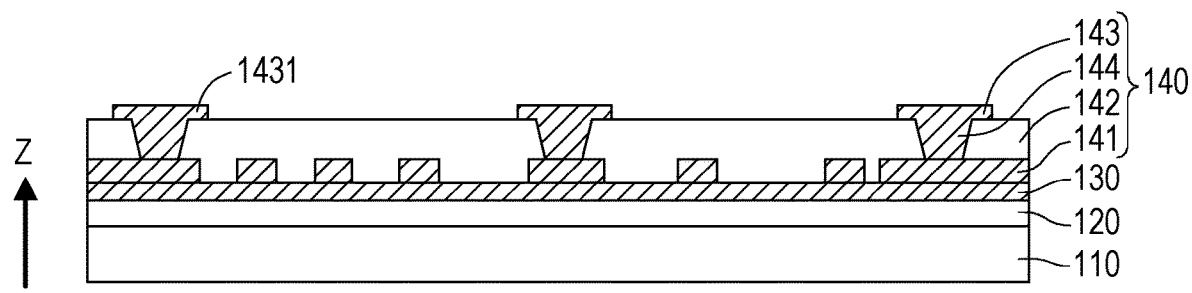

Next, with reference to FIG. 1B, a build-up circuit structure 140 is formed on the substrate 110. The build-up circuit structure 140 includes at least one inner circuit 141 (schematically illustrated as, for example but not limited to, one layer in FIG. 1B), at least one dielectric layer 142 (schematically illustrated as, for example but not limited to, one layer in FIG. 1B), an outer circuit 143, and multiple conductive vias 144. The inner circuit 141 is disposed on the seed layer 130 and contacts the seed layer 130. The dielectric layer 142 is disposed on the inner circuit 141 to cover the inner circuit 141 and a portion of the seed layer 130 exposed by the inner circuit 141. The outer circuit 143 is disposed on the dielectric layer 142 and has multiple pads 1431. The conductive vias 144 penetrate the dielectric layer 142 to electrically connect the inner circuit 141 and the outer circuit 143. In this embodiment, the material of the dielectric layer 142 may be, for example but not limited to, a photoimageable dielectric (PID) material or other suitable organic materials with low dielectric constants and low roughness to meet the requirements of high frequency and high speed. The inner circuit 141 and the outer circuit 143 may be thin circuits, and the materials of the inner circuit 141 and the outer circuit 143 may be, for example but not limited to, copper or other suitable metal.

Figure 1C:
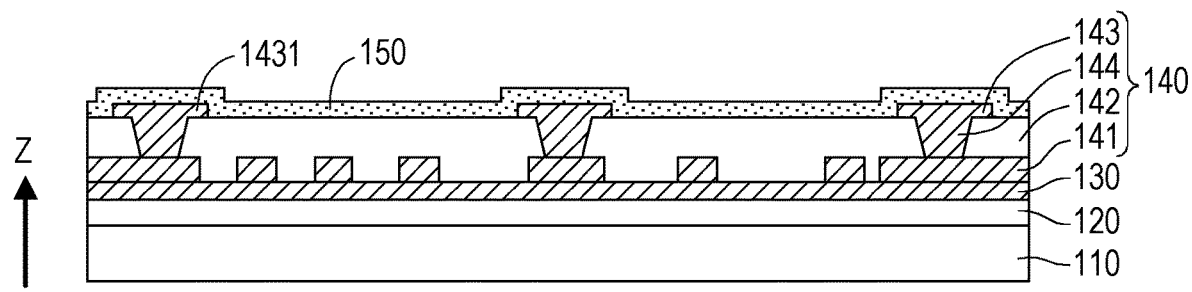

Next, with reference to FIG. 1C, a graphene oxide layer 150 is conformally formed on the build-up circuit structure 140 to cover the outer circuit 143 and the portion of the dielectric layer 142 exposed by the outer circuit 143. In this embodiment, the method of forming the graphene oxide layer 150 on the build-up circuit structure 140 may, for example, include the following steps: first coating graphene oxide in liquid phase on the build-up circuit structure 140, and then baking the graphene oxide to form the graphene oxide layer 150.

The thickness of the graphene oxide layer 150 may be, for example but not limited to, 0.5 nm to 500 nm. The material of the graphene oxide layer 150 is graphene oxide (GO) with insulating characteristics.

Figure 1D:
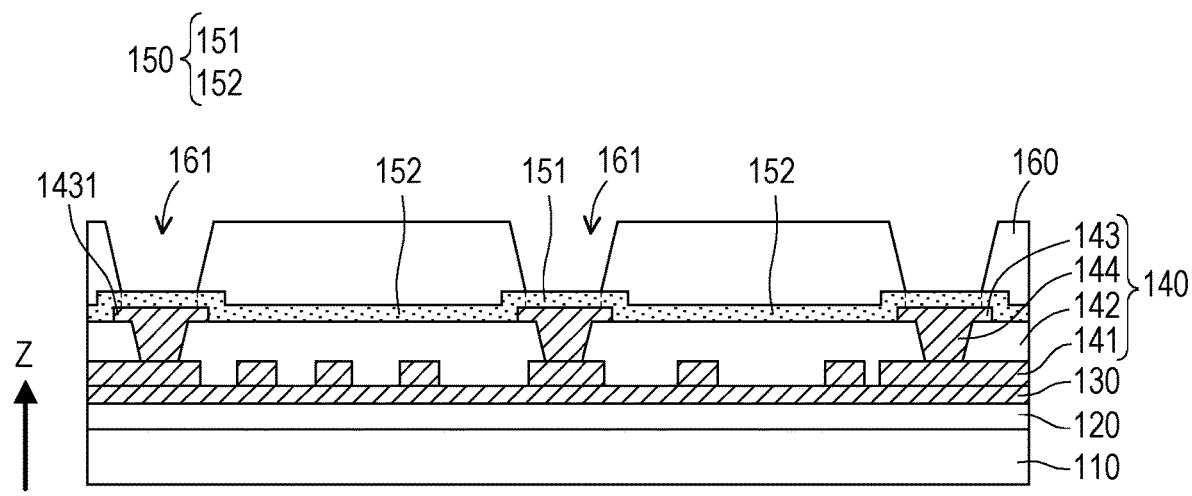

Next, with reference to FIG. 1D, an insulating material layer 160 is formed on the graphene oxide layer 150, such that the insulating material layer 160 and the build-up circuit structure 140 are respectively located on two opposite sides of the graphene oxide layer 150. The insulating material layer 160 has an opening 161. The opening 161 may expose a portion 151 of the graphene oxide layer 150, and the insulating material layer 160 may cover another portion 152 of the graphene oxide layer 150. In this embodiment, the material of the insulating material layer 160 is different from the material of the dielectric layer 142. The insulating material layer 160 may be another dielectric layer, and the material of the insulating material layer 160 may be, for example but not limited to, an Ajinomoto build-up film (ABF) or other suitable organic materials.

In this embodiment, since the carbonyl group, epoxy group, and hydroxyl group on the surface of graphene oxide may be bonded with metal (such as the copper of the outer circuit 143) and organic materials (such as the PID dielectric material of the dielectric layer 142 and the ABF of the insulating material layer 160) to generate a binding force, the graphene oxide layer 150 disposed between the insulating material layer 160 and the build-up circuit structure 140 may serve as an adhesive for improving the poor heterogeneous adhesion between the insulating material layer 160 and the dielectric layer 142 as well as between the insulating material layer 160 and the outer circuit 143, thereby enhancing the reliability and yield of the circuit board 100. In addition, the graphene oxide further has better ductility, and the graphene oxide in liquid phase is also good for coating in a large area.

Figure 1E:
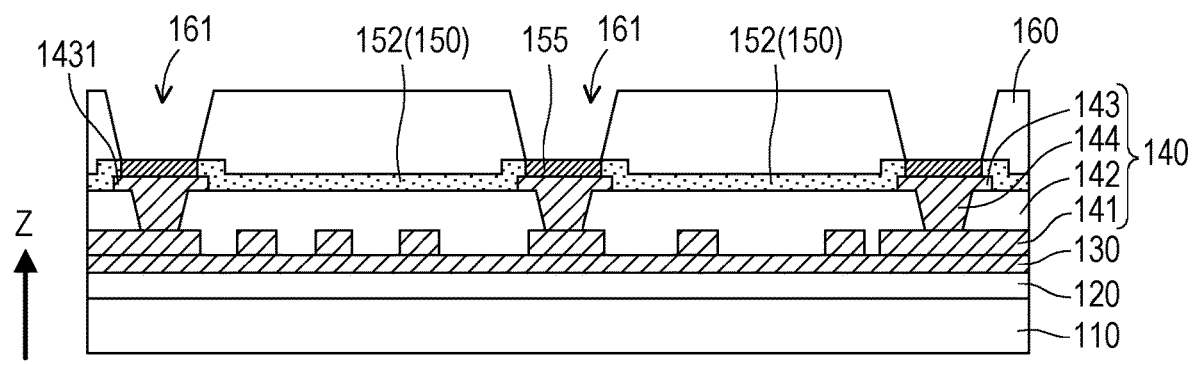

Next, with reference to FIG. 1E, the portion 151 of the graphene oxide layer 150 is reduced to a graphene layer 155. Specifically, in this embodiment, by the hydrogen plasma method or the solvothermal method, the graphene oxide in the portion 151 of the graphene oxide layer 150 is reduced to graphene, and the portion 151 is reduced to the graphene layer 155. The solvothermal method is performed, for example, with water vapor at 100° C. for at least 20 minutes. In this embodiment, since the thermal conductivity coefficient of graphene may be, for example, about 5,300 W/m·K and the resistivity thereof may be, for example, about $10^{-6}$ Ω·cm, the graphene layer 155 may have excellent thermal conductivity and electrical conductivity. In addition, since the thermal conductivity of graphene may be better than that of copper, the heat dissipation effect of the circuit board 100 may also be enhanced.

In this embodiment, the graphene oxide layer 150 and the graphene layer 155 are disposed at an interval. The graphene layer 155 may be disposed in correspondence to the pads 1431 of the outer circuit 143, and the other portion 152 of the graphene oxide layer 150 may be disposed in correspondence to the dielectric layer 142. In other words, the other portion 152 of the graphene oxide layer 150 may be located on an interface between the insulating material layer 160 and the dielectric layer 142 and be located on an interface between the insulating material layer 160 and the outer circuit 143. In addition, in this embodiment, in a normal direction Z of the build-up circuit structure 140, the graphene oxide layer 150 may overlap the dielectric layer 142, and the graphene layer 155 may overlap the pads 1431 of the outer circuit 143. In some embodiments, the graphene oxide layer 150 may contact the dielectric layer 142, and the graphene layer 155 may contact the pads 1431 of the outer circuit 143.

Figure 1F:
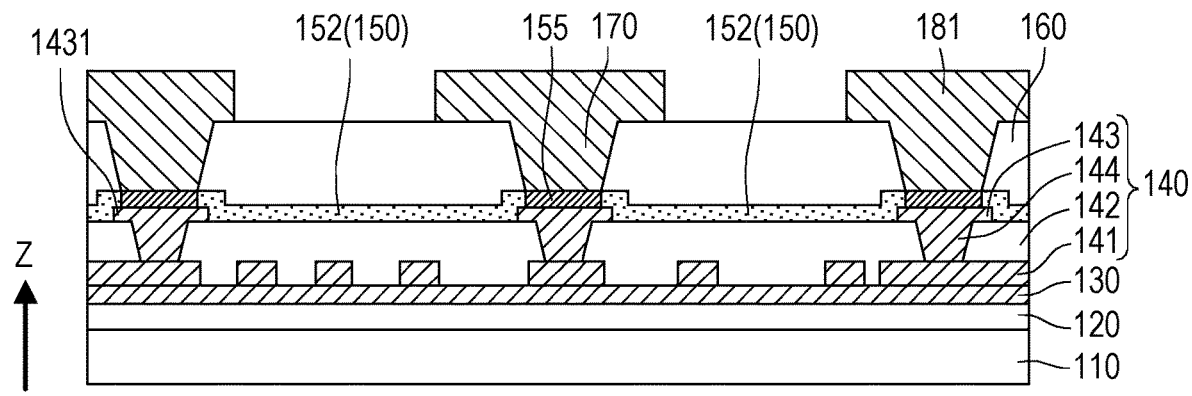

Next, with reference to FIG. 1F, a conductive material layer 170 is formed in the opening 161, and an inner circuit 181 is formed on the insulating material layer 160, such that the inner circuit 181 may contact the conductive material layer 170. The conductive material layer 170 may fill the opening 161, contact the graphene layer 155, and be electrically connected to the build-up circuit structure 140 through the graphene layer 155. In this embodiment, the material of the conductive material layer 170 may be, for example but not limited to, copper or other suitable conductive materials.

Figure 1G:
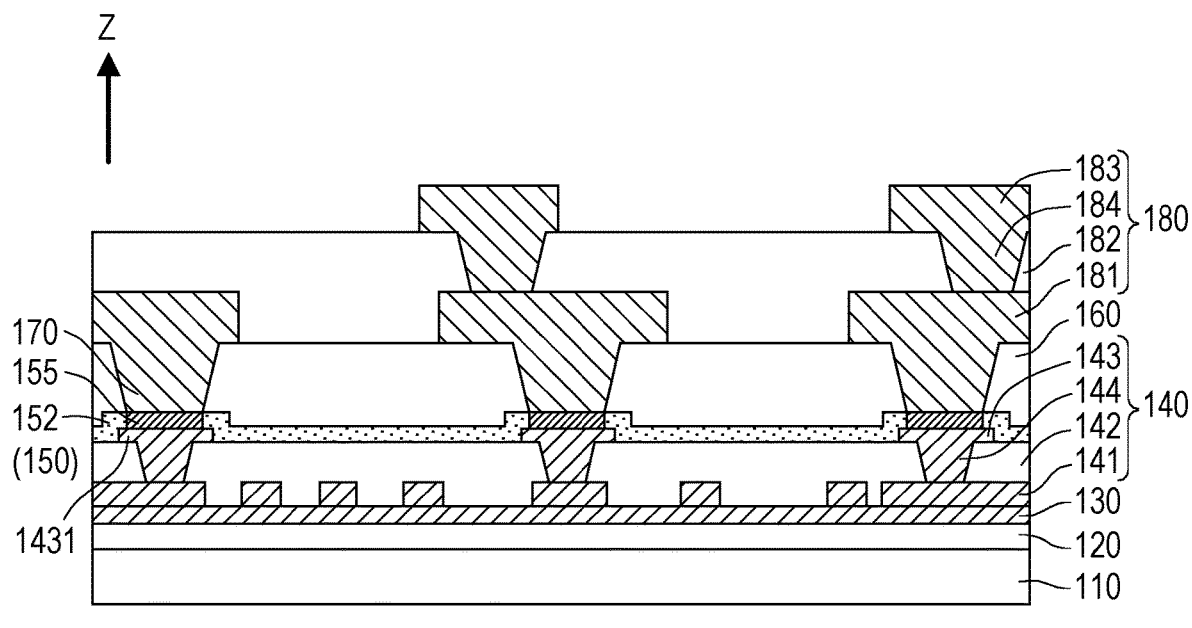

Next, with reference to FIG. 1G, a build-up circuit structure 180 is formed on the insulating material layer 160. The build-up circuit structure 180 includes at least one inner circuit 181 (schematically illustrated as, for example but not limited to, one layer in FIG. 1G), at least one dielectric layer 182 (schematically illustrated as, for example but not limited to, one layer in FIG. 1G), an outer circuit 183, and multiple conductive vias 184. The dielectric layer 182 is disposed on the inner circuit 181 to cover the inner circuit 181 and a portion of the insulating material layer 160 exposed by the inner circuit 181. The outer circuit 183 is disposed on the dielectric layer 182. The conductive vias 184 penetrate the dielectric layer 182 to electrically connect the inner circuit 181 and the outer circuit 183. In this embodiment, the material of the dielectric layer 182 may be the same as the material of the insulating material layer 160, and details thereof are not repeated herein. By this time, the manufacturing of the circuit board 100 of this embodiment has been substantially completed.

In short, the circuit board 100 of this embodiment may include the substrate 110, the build-up circuit structure 140, the graphene oxide layer 150, the graphene layer 155, and the insulating material layer 160. The build-up circuit structure 140 is disposed on the substrate 110. The build-up circuit structure 140 includes at least one inner circuit 141, at least one dielectric layer 142, the outer circuit 143, and multiple conductive vias 144. The dielectric layer 142 is disposed on the inner circuit 141. The outer circuit 143 is disposed on the dielectric layer 142. The conductive vias 144 penetrate the dielectric layer 142 and electrically connects the inner circuit 141 and the outer circuit 143. The graphene oxide layer 150 and the graphene layer 155 are disposed on the build-up circuit structure 140 at an interval. The graphene oxide layer 150 is disposed in correspondence to the dielectric layer 142, and the graphene layer 155 is disposed in correspondence to the outer circuit 143. The insulating material layer 160 is disposed on the graphene oxide layer 150 and the graphene layer 155. The insulating material layer 160 has the opening 161, and the opening 161 exposes the graphene layer 155.

FIG. 2A to FIG. 2D are schematic cross-sectional views showing a manufacturing method of a circuit board according to another embodiment of the disclosure. A manufacturing method of a circuit board 200 in this embodiment may include but not be limited to the following steps.

Figure 2A:
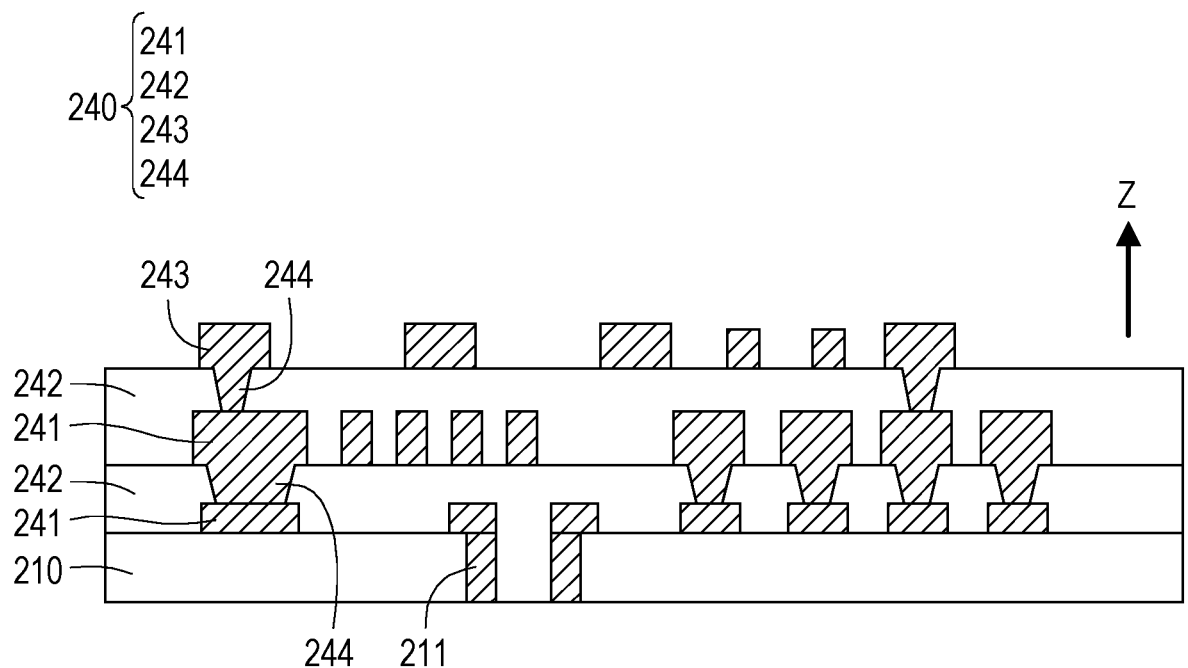
FIG. 2A to FIG. 2D are schematic cross-sectional views showing a manufacturing method of a circuit board according to another embodiment of the disclosure.

First, with reference to FIG. 2A, a substrate 210 is provided, and a build-up circuit structure 240 is formed on the substrate 210. The substrate 210 has a conductive via 211 to be electrically connected to the build-up circuit structure 240. In this embodiment, the material of the substrate 210 may include an ABF, a prepreg such as an epoxy glass cloth that is flame retardant and self-extinguishing (FR-4) or a bismaleimide triazine (BT) resin, or a photosensitive dielectric layer material such as benzocylobutene (BCB), bismaleimide triazine (BT), a liquid crystal polymer, polyimide (PI), polyvinyl ether, polyphenylene ether, aramide, epoxy resin, glass fiber, and a composition thereof, but the disclosure is not limited thereto.

The build-up circuit structure 240 includes at least one inner circuit 241 (schematically illustrated as, for example but not limited to, two layers in FIG. 2A), at least one dielectric layer 242 (schematically illustrated as, for example but not limited to, two layers in FIG. 2A), an outer circuit 243, and multiple conductive vias 244. The inner circuit 241 is disposed on the substrate 210 and contacts the substrate 210. The dielectric layer 242 is disposed on the inner circuit 241 to cover the inner circuit 241 and a portion of the substrate 210 exposed by the inner circuit 241. The outer circuit 243 is disposed on the dielectric layer 242 and has multiple pads 2431. The conductive vias 244 penetrate the dielectric layer 242 to electrically connect the inner circuit 241 and the outer circuit 243. In this embodiment, the material of the dielectric layer 242 may be, for example but not limited to, an ABF, a prepreg, a PID material, an epoxy-resin/filler/glass-fiber composite material. The materials of the inner circuit 241 and the outer circuit 243 may be, for example but not limited to, copper or other suitable metal.

Figure 2B:
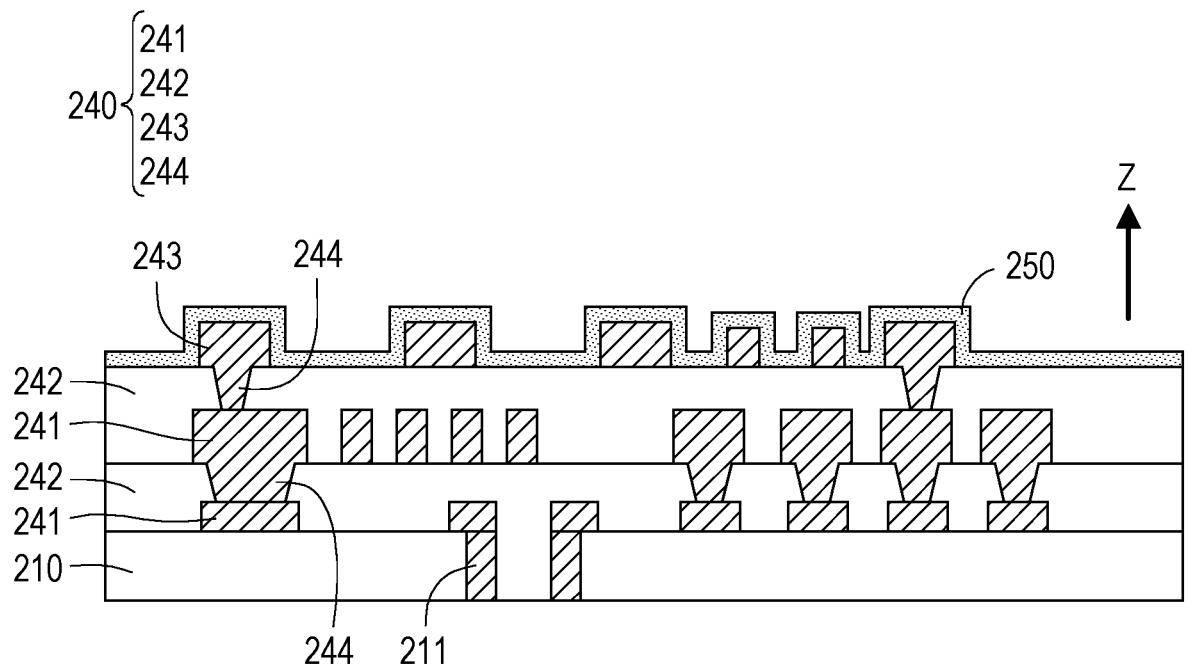

Next, with reference to FIG. 2B, a graphene oxide layer 250 is conformally formed on the build-up circuit structure 240 to cover the outer circuit 243 and the portion of the dielectric layer 242 exposed by the outer circuit 243. The thickness of the graphene oxide layer 250 may be, for example but not limited to, 0.5 nm to 500 nm. The material of the graphene oxide layer 250 is graphene oxide with insulating characteristics.

Figure 2C:
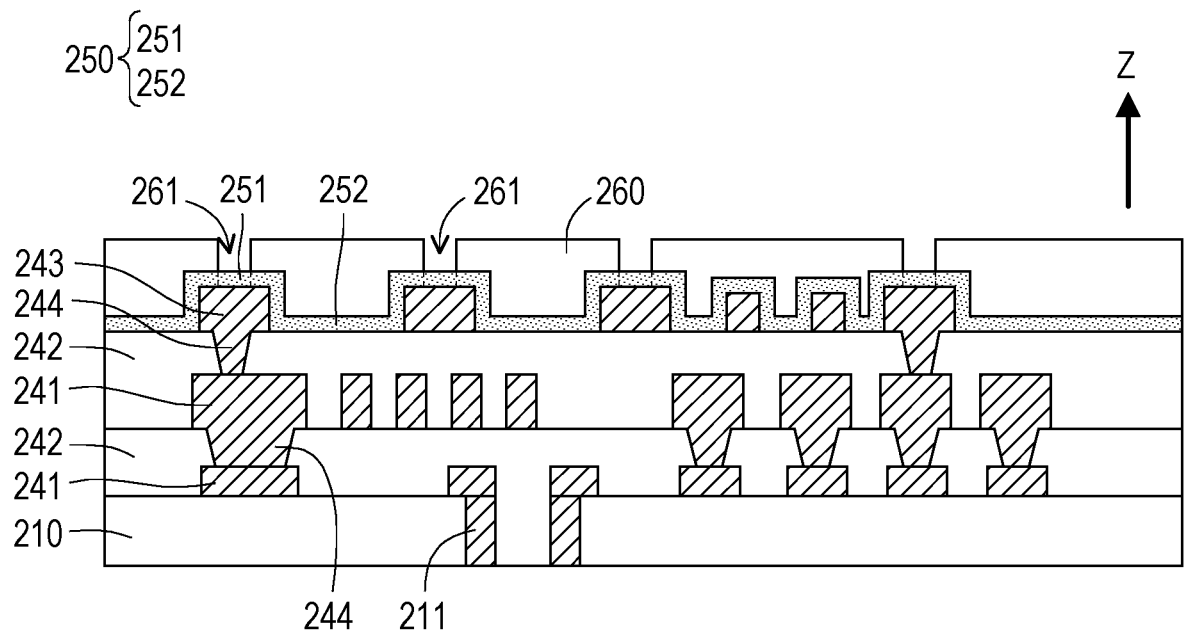

Next, with reference to FIG. 2C, an insulating material layer 260 is formed on the graphene oxide layer 250, such that the insulating material layer 260 and the build-up circuit structure 240 are respectively located on two opposite sides of the graphene oxide layer 250. The insulating material layer 260 has an opening 261. The opening 261 may expose a portion 251 of the graphene oxide layer 250, and the insulating material layer 260 may cover another portion 252 of the graphene oxide layer 250. In this embodiment, the material of the insulating material layer 260 is different from the material of the dielectric layer 242. The insulating material layer 260 may be a solder mask layer and the material of the insulating material layer 260 may be, for example but not limited to, green paint or other suitable solder mask ink.

In this embodiment, since the hydroxy group and epoxy group on the surface of graphene oxide may be bonded with metal (such as the copper of the outer circuit 243) and organic materials (such as the material of the dielectric layer 242 and the green paint of the insulating material layer 260) to generate a binding force, the graphene oxide layer 250 disposed between the insulating material layer 260 and the build-up circuit structure 240 may serve as an adhesive for improving the poor heterogeneous adhesion between the insulating material layer 260 and the dielectric layer 242 as well as between the insulating material layer 260 and the outer circuit 243, thereby enhancing the reliability and yield of the circuit board 200.

For example, in this embodiment, a cross-cut test was performed by using a 3M tape to check the adhesion of a solder mask layer. First, Comparative Example 1, Comparative Example 2, and an experimental example are provided. In Comparative Example 1, surface roughening was performed on the outer circuit first, and then a solder mask layer was formed on the outer circuit. In Comparative example 2, a solder mask was directly formed on the outer circuit. In the experimental example, graphene oxide was formed on the outer circuit first, and then a solder mask was formed on the graphene oxide. Next, after the cross-cut test, the detached area of the solder mask layer in Comparative Example 1 is less than 5%, the detached area of the solder mask layer in Comparative Example 2 is greater than 65%, and the detached area of the solder mask layer in the experimental example is less than 5%. Therefore, according to the above test results, the method of using graphene oxide may replace the method of surface roughening to effectively enhance the adhesion of the solder mask layer to the outer circuit without roughening and avoid signal loss due to the surface roughening on the outer circuit.

Figure 2D:
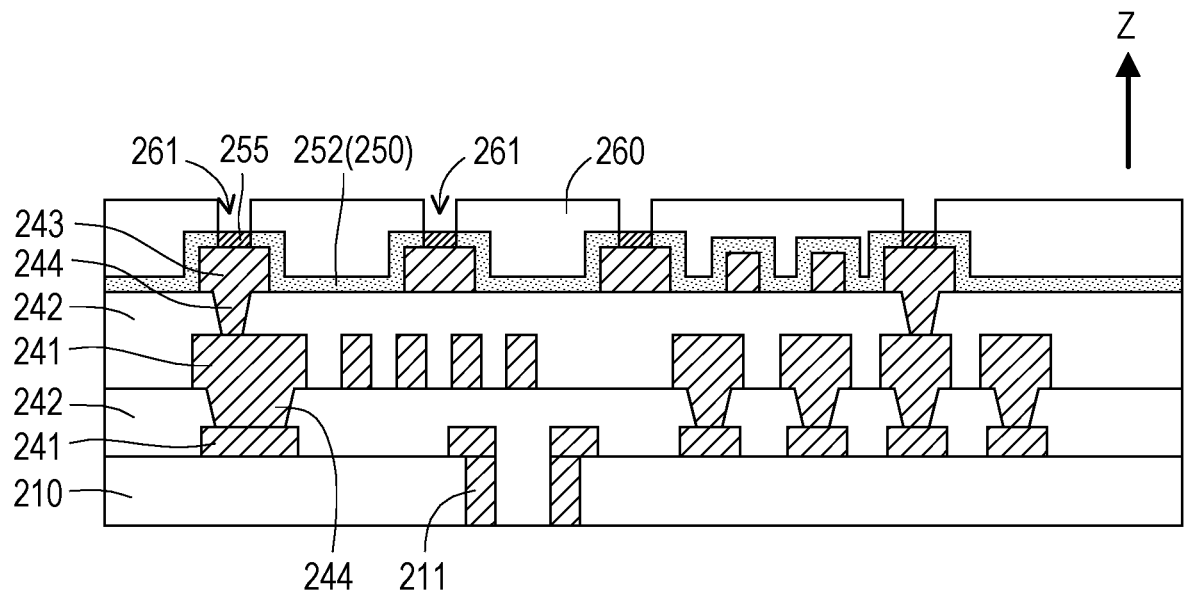

Next, with reference to FIG. 2D, the portion 251 of the graphene oxide layer 250 is reduced to a graphene layer 255. Specifically, in this embodiment, by the hydrogen plasma method or the solvothermal method, the graphene oxide in the portion 251 of the graphene oxide layer 250 is reduced to graphene, and the portion 251 is reduced to the graphene layer 255. The graphene layer 255 may have excellent thermal conductivity and electrical conductivity and thus may enhance the heat dissipation effect of the circuit board 100. In addition, the graphene layer 255 may be used to replace surface treatments such as the electroless nickel electroless palladium immersion gold (ENEPIG) technique to protect the pads 2431 and avoid the pads 2431 from oxidation.

In this embodiment, the graphene oxide layer 250 and the graphene layer 255 are disposed at an interval. The graphene layer 255 may be disposed in correspondence to the pads 2431 of the outer circuit 243, and the other portion 252 of the graphene oxide layer 250 may be disposed in correspondence to the dielectric layer 242. In other words, the other portion 252 of the graphene oxide layer 250 may be located on an interface between the insulating material layer 260 and the dielectric layer 242 and be located on an interface between the insulating material layer 260 and the outer circuit 243. In addition, in this embodiment, in a normal direction Z of the build-up circuit structure 240, the graphene oxide layer 250 may overlap the dielectric layer 242, and the graphene layer 255 may overlap the pads 2431 of the outer circuit 243. In some embodiments, the graphene oxide layer 250 may contact the dielectric layer 242, and the graphene layer 255 may contact the pads 2431 of the outer circuit 243. By this time, the manufacturing of the circuit board 200 of this embodiment has been substantially completed.

In short, the circuit board 200 of this embodiment may include the substrate 210, the build-up circuit structure 240, the graphene oxide layer 250, the graphene layer 255, and the insulating material layer 260. The build-up circuit structure 240 is disposed on the substrate 210. The build-up circuit structure 240 includes at least one inner circuit 241, at least one dielectric layer 242, the outer circuit 243, and multiple conductive vias 244. The dielectric layer 242 is disposed on the inner circuit 241. The outer circuit 243 is disposed on the dielectric layer 242. The conductive vias 244 penetrate the dielectric layer 242 and electrically connects the inner circuit 241 and the outer circuit 243. The graphene oxide layer 250 and the graphene layer 255 are disposed at an interval on the build-up circuit structure 240. The graphene oxide layer 250 is disposed in correspondence to the dielectric layer 242, and the graphene layer 255 is disposed in correspondence to the outer circuit 243. The insulating material layer 260 is disposed on the graphene oxide layer 250 and the graphene layer 255. The insulating material layer 260 has the opening 261, and the opening 261 exposes the graphene layer 255.

Other embodiments are described below for illustrative purposes. It should be noted that the following embodiments use the reference numerals and part of the contents of the foregoing embodiments, with the same reference numerals used to denote the same or similar elements, and the description of the same technical contents is omitted. For the description of the omitted parts, reference may be made to the foregoing embodiments, and details are not described in the following embodiment.

Figure 2E:
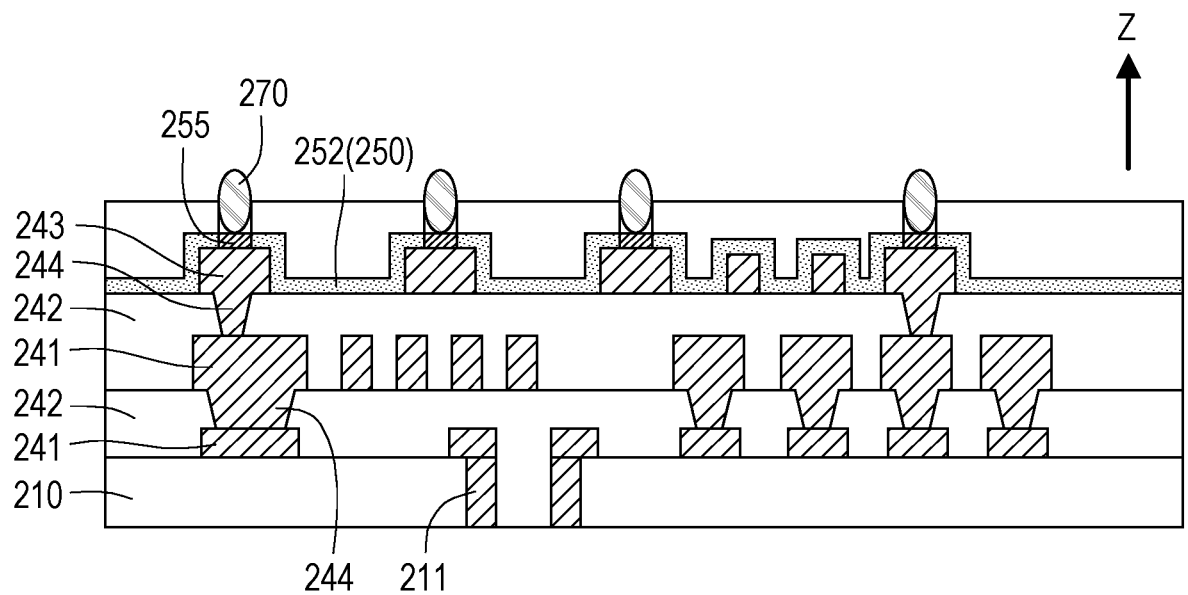
FIG. 2E to FIG. 2F are schematic cross-sectional views showing a manufacturing method of a chip package according to an embodiment of the disclosure.
Figure 2F:
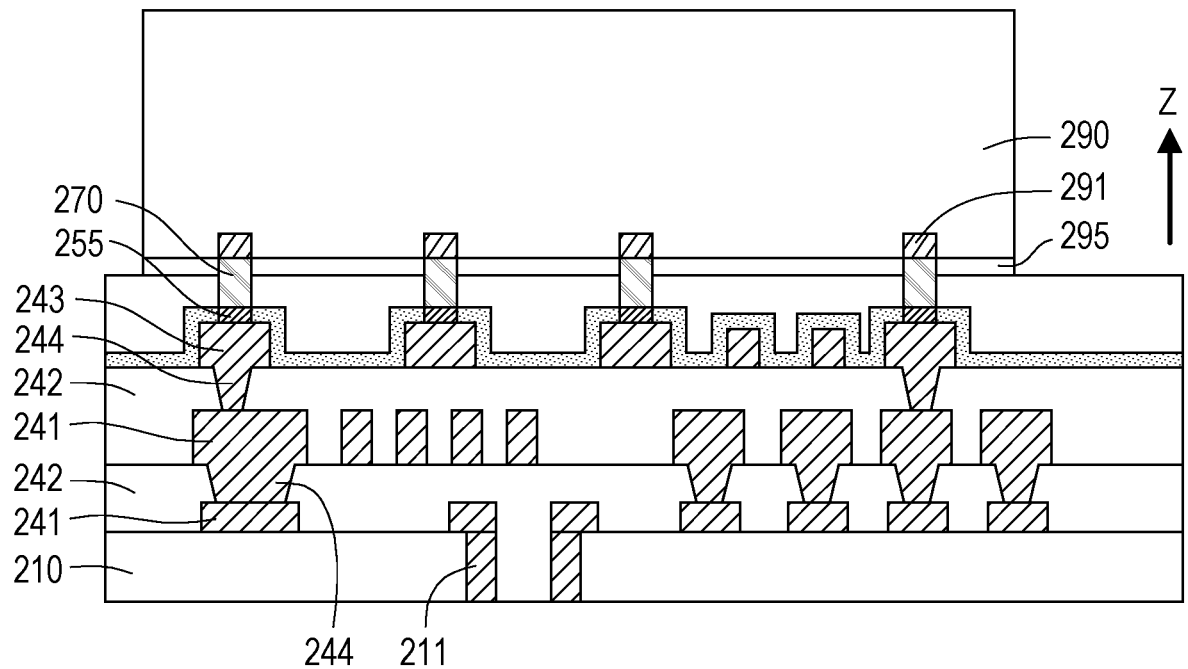

FIG. 2E to FIG. 2F are schematic cross-sectional views showing a manufacturing method of a chip package according to an embodiment of the disclosure. FIG. 2E to FIG. 2F are steps following FIG. 2A to FIG. 2D. Components in the embodiment of FIG. 2E to FIG. 2F the same as or similar to those in the embodiment of FIG. 2A to FIG. 2D may use the same material or method, so the same and similar description in the two embodiments will not be repeated in the following paragraphs, where only differences between the two embodiments are explained.

With reference to FIG. 2E, after the circuit board 200 of FIG. 2D is formed, a conductive material layer 270 is formed in the opening 261. The conductive material layer 270 may contact the graphene layer 255, and the conductive material layer 270 may be electrically connected to the build-up circuit structure 140 through the graphene layer 255. In this embodiment, the conductive material layer 270 may be, for example, a solder ball or a solder paste, and the material of the conductive material layer 270 may be, for example, tin or other suitable conductive materials, but the disclosure is not limited thereto.

Next, with reference to FIG. 2F, a chip 290 is disposed on the insulating material layer 260. Specifically, the chip 290 has pads 291. The chip 290 may be bonded with and electrically connected to the conductive material layer 270 after reflow through the pads 291 and be fixed on the insulating material layer 260 through a primer 295. By this time, the manufacturing of the chip package 20 of this embodiment has been substantially completed.

In summary, in the circuit board and the manufacturing method thereof in an embodiment of the disclosure, the graphene oxide layer disposed between the insulating material layer and the build-up circuit structure may improve the poor heterogeneous adhesion between the insulating material layer and the build-up circuit structure (i.e., improving the binding force between the insulating material layer and the build-up circuit structure), thereby enhancing the reliability and yield of the circuit board. In addition, with graphene disposed, the conductive material layer may be electrically connected to the build-up circuit structure, which may enhance the heat dissipation effect of the circuit board and may protect the outer circuit from oxidation.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:
1. A circuit board, comprising:
a substrate;
a build-up circuit structure, disposed on the substrate and comprising:
at least one inner circuit;
at least one dielectric layer, disposed on the at least one inner circuit;
an outer circuit, disposed on the at least one dielectric layer; and a plurality of conductive vias, penetrating the at least one dielectric layer and electrically connecting the at least one inner circuit and the outer circuit;
a graphene oxide layer and a graphene layer, disposed on the build-up circuit structure at an interval, wherein the graphene oxide layer is disposed in correspondence to the at least one dielectric layer, and the graphene layer is disposed in correspondence to the outer circuit; and
an insulating material layer, disposed on the graphene oxide layer and the graphene layer, wherein the insulating material layer has an opening, and the opening exposes the graphene layer.

2. The circuit board according to claim 1, wherein a material of the at least one dielectric layer is different from a material of the insulating material layer.

3. The circuit board according to claim 1, wherein the insulating material layer is another dielectric layer or a solder mask layer.

4. The circuit board according to claim 1, wherein in a normal direction of the build-up circuit structure, the graphene oxide layer overlaps the at least one dielectric layer, and the graphene layer overlaps the outer circuit.

5. The circuit board according to claim 1, wherein the graphene oxide layer contacts the at least one dielectric layer, and the graphene layer contacts the outer circuit.

6. The circuit board according to claim 1, further comprising:
a conductive material layer, disposed in the opening and electrically connected to the build-up circuit structure through the graphene layer.

7. The circuit board according to claim 1, wherein the graphene oxide layer is located on an interface between the insulating material layer and the at least one dielectric layer and is located on an interface between the insulating material layer and the outer circuit.

8. A manufacturing method of a circuit board, comprising:
providing a substrate;
forming a build-up circuit structure on the substrate, wherein the build-up circuit structure comprises:
at least one inner circuit;
at least one dielectric layer, disposed on the at least one inner circuit;
an outer circuit, disposed on the at least one dielectric layer; and
a plurality of conductive vias, penetrating the at least one dielectric layer and electrically connecting the at least one inner circuit and the outer circuit;
forming a graphene oxide layer on the build-up circuit structure;
forming an insulating material layer on the graphene oxide layer, wherein the insulating material layer has an opening, and the opening exposes a portion of the graphene oxide layer; and
reducing the portion of the graphene oxide layer to a graphene layer, wherein the graphene layer is disposed in correspondence to the outer circuit, and another portion of the graphene oxide layer is disposed in correspondence to the at least one dielectric layer.

9. The manufacturing method of the circuit board according to claim 8, wherein a material of the at least one dielectric layer is different from a material of the insulating material layer.

10. The manufacturing method of the circuit board according to claim 8, wherein the insulating material layer is another dielectric layer or a solder mask layer.

11. The manufacturing method of the circuit board according to claim 8, wherein in a normal direction of the build-up circuit structure, the graphene oxide layer overlaps the at least one dielectric layer, and the graphene layer overlaps the outer circuit.

12. The manufacturing method of the circuit board according to claim 8, wherein the graphene oxide layer contacts the at least one dielectric layer, and the graphene layer contacts the outer circuit.

13. The manufacturing method of the circuit board according to claim 8, further comprising:
forming a conductive material layer in the opening, wherein the conductive material layer is electrically connected to the build-up circuit structure through the graphene layer.

14. The manufacturing method of the circuit board according to claim 8, wherein the graphene oxide layer is located on an interface between the insulating material layer and the at least one dielectric layer and is located on an interface between the insulating material layer and the outer circuit.

15. The manufacturing method of the circuit board according to claim 8, wherein a step of reducing the portion of the graphene oxide layer to the graphene layer further comprises: performing the step by using plasma or by a solvothermal method for the portion of the graphene oxide layer.

* * * * *